United States Patent [19]
Tomozawa et al.

[11] 3,935,083
[45] Jan. 27, 1976

[54] METHOD OF FORMING INSULATING FILM ON INTERCONNECTION LAYER

[75] Inventors: Akihiro Tomozawa, Kodaira; Kensuke Nakata, Tokorozawa; Akira Kikuchi; Takashi Agastuma, both of Kodaira, Japan

[73] Assignee: Hitachi, Ltd., Japan

[22] Filed: Jan. 7, 1974

[21] Appl. No.: 431,488

[30] Foreign Application Priority Data
Jan. 12, 1973  Japan............................ 48-5973

[52] U.S. Cl.................... 204/38 A; 29/588; 156/3; 204/15; 357/72
[51] Int. Cl.². C25D 5/02; B01J 17/00; H01L 23/28
[58] Field of Search...... 204/15, 38 A; 29/588, 590, 29/591, 625, 628, 629, 627; 156/3, 8, 17, 22; 357/54, 72

[56] References Cited
UNITED STATES PATENTS

| | | | |
|---|---|---|---|
| 3,741,880 | 6/1973 | Shiba et al. | 317/101 R |
| 3,785,937 | 1/1974 | McMahon et al. | 317/234 E |
| 3,798,135 | 3/1974 | Bracken et al. | 204/15 |

Primary Examiner—T. M. Tufariello
Attorney, Agent, or Firm—Craig & Antonelli

[57] ABSTRACT

A method for forming an insulating film on an interconnection layer for an integrated circuit, or the like, includes the steps of forming an aluminum layer on the surface of a substrate, oxidizing a thin portion of the upper surface of the aluminum layer in order to convert the thin parts into a porous alumina film, applying a photoresist film having a predetermined pattern on the upper surface of the porous alumina film, and etching those portions of the porous alumina film, together with the aluminum layer which are not covered with the photoresist film. Then, the photoresist film is removed and an aluminum film is formed on the entire surface of the resulting substrate; the aluminum film is oxidized, to form a porous alumina film, and the surface of the remaining aluminum layer is anodized, in order to form a non-porous alumina film. Finally, unnecessary portions of the remaining porous alumina film are removed, and a film is formed by chemical vapor deposition on the resulting structure.

4 Claims, 10 Drawing Figures

FIG. I(A)
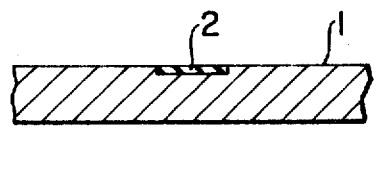
FIG. I(B)
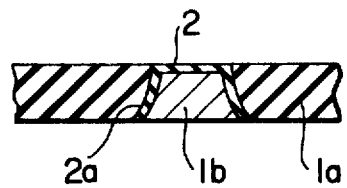
FIG. 2(A)
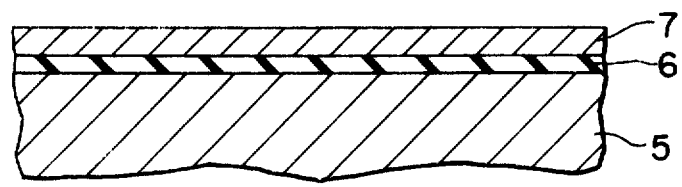
FIG. 2(B)
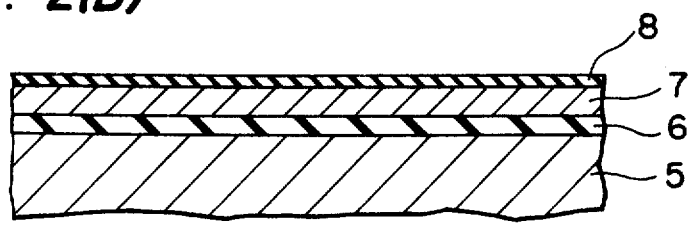
FIG. 2(C)
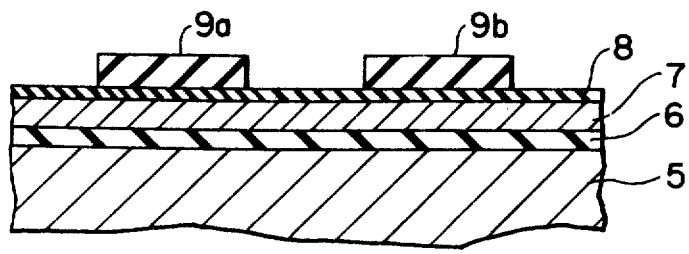

METHOD OF FORMING INSULATING FILM ON INTERCONNECTION LAYER

CROSS REFERENCES TO RELATED APPLICATIONS

This application relates to subject matter described in U.S. Pat. Application No. 431,556 filed on even date herewith, now U.S. Pat. No. 3,855,112, by the applicants of the present application and assigned to the assignee of the present application, entitled "Method of Manufacturing Interconnection Substrate" which relates to Japanese Priority Application 5979/73 filed in Japan on Jan. 12, 1973.

BACKGROUND OF THE INVENTION

The present invention relates to a method of forming an insulating film on, for example, the interconnection layer in an integrated circuit, or the like. The surface of the interconnection portions of the uppermost layer of multi-interconnection layers are oxidized to form a film of a metallic oxide, so as to enhance the moisture resistance of the interconnection layers and to enable the manufacture of a protective film or insulating film for the interconnection layers, so as to prevent deterioration of the moisture-resisting protective film which covers the uppermost layer of the interconnection portions.

DESCRIPTION OF THE PRIOR ART

In general, in integrated circuits and the like, in order to prevent metallic interconnection portions made of aluminum or the like from being corroded by moisture or the like, subsequent to the formation of the interconnections, a protective film has been formed, for example, by a chemical vapor deposition technique on the surface of the aluminum interconnection portions.

However, such a formed aluminum interconnection portion has, at its shoulder portions, sharp corners, and the chemical-vapor-deposition film to be formed on the upper surface of the aluminum interconnections does not have a uniform thickness; also, the thickness is extremely thin in the vicinity of the corners of the interconnection portion. As a result, the possibility of existence of pinholes is quite high, so that moisture can penetrate into the chemical-vapor-deposition film and corrode the aluminum interconnection portions, thereby causing disconnection problems.

On the other hand, if the chemical-vapor-deposition film has a substantial thickness, in order to prevent the occurrence of pinholes, because of the difference in the coefficients of thermal expansion of the substrate and the chemical-vapor-deposition film, cracks result in the chemical-vapor-deposition film due to thermal stresses resulting from heat generated during the operation of the semiconductor device.

In one technique of forming a multi-layer interconnection arrangement, which has been previously attempted, in order to enhance the moisture resistance properties, the chemical-vapor-deposition film has been formed so that the thickness thereof is evenly distributed along the surface of the interconnection portions and, also, the surface of the interconnection portions have been lightly anodized to form a thin film of a metallic oxide thereon. More specifically, the upper surface of an aluminum layer in a multi-layer laminar structure is thinly anodized to form an alumina layer and, subsequently, the structure is then etched in order to provide a gentle or gradual slope for the ends and side portions of the upper surface of the interconnection portions of the first layer, in order that the insulating film and interconnection portions of a second subsequent layer may be uniformly formed on the upper surface of the interconnection portions of the first layer and, moreover, in order that any short-circuiting and disconnecting problems might be prevented.

In this method, however, the alumina film is formed only on the upper surface of the aluminum interconnection portions, the chemical-vapor-deposition film itself is not satisfactorily resistant to moisture and, in addition, the film is somewhat thin at the side portions of the interconnections, so that the aluminum interconnection portions become corroded at the side portions thereof as a result of moisture or the like which penetrates through the chemical-vapor-deposition film.

In order to prevent the aluminum interconnection portions from becoming corroded at the sides thereof, one proposal has been to cover the entire surface of the aluminum interconnection portions with an alumina film, as depicted in FIG. 1 (B), of the drewings, so as to enhance the reliability and electrical characteristics of the interconnection portion against moisture and chemicals. This method includes the formation of a non-porous alumina film 2, which acts as an insulator, at a portion of the surface of the aluminum layer 1, as depicted in FIG. 1 (A). The aluminum layer 1 is anodized by using the alumina film 2 as a mask, with a porous alumina film 1 (a) being formed as shown in FIG. 1 (B). In this case, the aluminum layer beneath the non-porous alumina film 2 is masked by the alumina film 2, and, accordingly is not anodized, with an aluminum interconnection portion 1 (b) being formed. By using a predetermined electrolyte for the anodization, a non-porous alumina film 2a can be formed on the sides of the aluminum interconnection portion from the electrolyte, e.g., an oxalic acid, which penetrates through the porous alumina.

Since, however, in the above method, the entire thickness of the evaporated and formed aluminum layer must be anodized, this method has had disadvantages in that a considerable amount of time is required to carry out the method and in that there sometimes remain portions which are not anodized. For this reason, in order to perfectly anodize the side portions of all of the aluminum interconnection portions, it is necessary to partially short-circuit the aluminum interconnections therebetween, which necessarily leads to the disadvantage that the number of steps required in the method is increased and the efficiency of manufacture decreases.

SUMMARY OF THE INVENTION

The present invention eliminates the above disadvantages and problems, by oxidizing a thin upper surface portion of a metallic layer which is evaporated and formed on a substrate to form a metallic oxide film. A photoresist film, employed as a mask, is formed on the metallic oxide film, and an etching treatment is applied thereto, to form interconnection portions. Thereafter, a second metallic film is formed on the substrates to cover all of the surfaces of the interconnection portions and the second metallic film is completely oxidized to form a porous film therefrom. Thereafter, an additional oxidizing treatment is carried out to form a non-porous film on all of the surfaces of the interconnection portions, so that the sides of the interconnection portions can also be covered with a metallic oxide film thereby significantly enhancing the degree of moisture resistance. Also, a metallic layer which is formed by evaporation does not have to be oxidized, as compared with the prior art, but all that is necessary is that the second thin metallic film which is evaporated and formed subsequent to the formation of the interconnection portions, be oxidized, so as to permit the time required for carrying out the method to be shortened and to permit metallic oxidization to be perfectly effective.

Moreover, since the second metallic film is oxidized, a reliable and uniform oxidization treatment can be effected even when the interconnection substrate has stepped portions and, since a simple oxidization process is carried out subsequent to the formation of the interconnection portions, the present invention can be employed for the manufacture of an interconnection substrate having a high degree of integration, such as in an MOS device and an LSI.

Also, since the interconnection portions are formed by etching the metallic layer underneath a metallic oxide film, the upper surface ends and side portions of the interconnection portions are formed to have a gentle slope, so that a moisture-resistant protective film, such as a film deposited by chemical-vapor-deposition techniques, can be disposed on the interconnection portions with a uniform thickness and with a smooth surface. As a result, pinhole deterioration of the chemical-vapor-deposition film can be prevented and corrosion of the interconnection portions by water or chemicals can be avoided.

BRIEF DESCRIPTION OF THE DRAWINGS:

FIGS. 1 (A) and 1 (B) are cross sectional views for explaining the above-mentioned prior art method of forming a protective film made of a metallic oxide on the surface of an interconnection portion.

DETAILED DESCRIPTION OF THE INVENTION

Figure 2D:
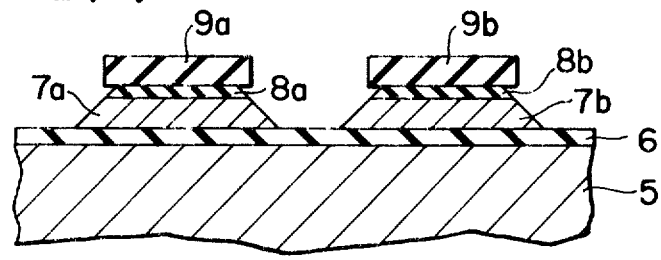
FIGS. 2 (A) – 2(H) are cross sectional side views of a substrate and interconnection layers for explaining the steps of manufacture of an interconnection substrate in accordance with an embodiment of the present invention.
Figure 2E:
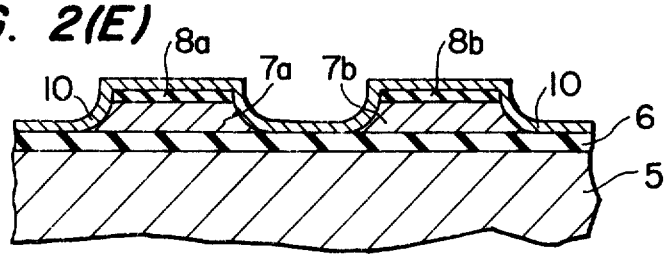
Figure 2F:
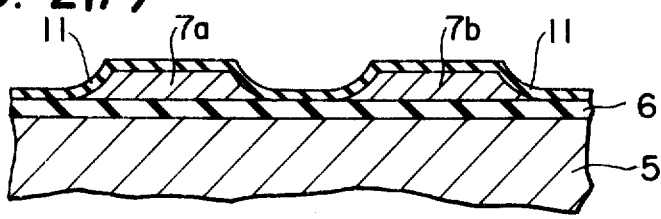
Figure 2G:
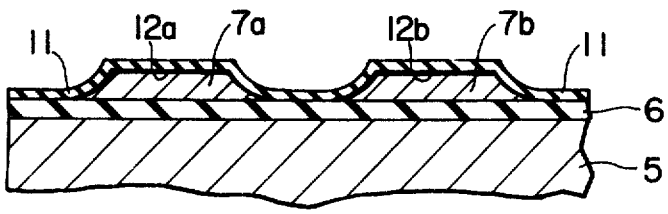
Figure 2H:
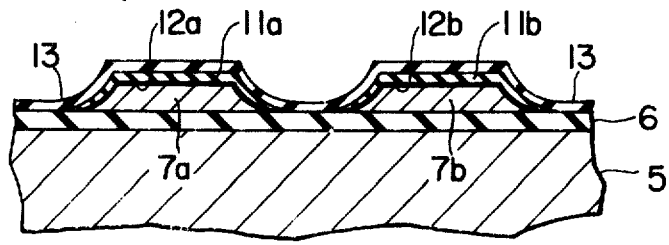

With reference now to FIGS. 2 (A) – 2(H), an aluminum layer 7 is initially evaporated onto a protective film (or onto an underlying insulating protective film) 6, such as $SiO_2$, $Si_3N_4$ and $SiO_2$ — $P_2O_5$, disposed on a semiconductor substrate (or on an underlying conductor portion) 5, such as silicon, germanium and an intermetallic compound, or an insulator such as ceramic and glass plates. The thickness of the aluminum layer 7 is approximately 1.4 microns.

Then, as shown in FIG. 2 (B) the upper surface of the aluminum layer 7 is oxidized by a conventional anodization process, so as to form a porous alumina ($Al_2O_3$) film 8. The porous alumina film 8 may be formed by oxidizing the aluminum layer 7 and, for such oxidization process, a 5% oxalic acid may be employed as the treating liquid during anodization. The anodization process is carried out for 60 minutes under an applied voltage of 1 volt using such a treating solution. As a result a porous alumina film 8, 1500 A thick, is formed on aluminum layer 7.

Then, as shown in FIG. 2 (C) a photoresist film 9a, 9b is selectively formed by a conventional photoresist deposition process, for example, the spinner method, on the porous alumina film 8.

Next, using the selectively formed photoresist film portions 9a and 9b as a corrosion-proof mask, the aluminum layer 7 and the alumina film 8 are etched. The degree of adherence of the photoresist film 9a, 9b to the alumina film 8 is quite strong. A suitable etchant may consist, for example, of a mixed solution of phosphoric acid ($H_3PO_4$), acetic acid ($CH_3COOH$), water ($H_2O$), ammonium fluoride ($NH_4F$) and nitric acid ($HNO_3$), mixed in respective proportions of 760cc, 150cc, 50cc, 20–60cc, and 30cc. With the porous alumina film 8 having an etching rate greater than the etching rate of the aluminum layer 7, with the volume of $NH_4F$ in the etchant within the above range of 20–60cc, the etching rate ratio of the alumina layer 8 to the aluminum layer 7 can be from 2 : 1 to 3 : 1. Namely, for example, the etching rate of the etchant for the aluminum layer 7 may be 1000 A/min., while that for the porous alumina layer 8 is 2,500 A/min. The temperature of the solution may lie within a range of about 30° to 50°, and is preferably at 40°C.

With the etching rate of the alumina film 8 being greater than that of the aluminum film 7, and the alumina film 8 being etched to a greater degree in the lateral direction, rather than vertically, the sloped formation for the aluminum layer portions 7a, 7b upon which the porous alumina film 8a, 8b is formed, results.

Then, the photoresist film portions 9a and 9b are removed by a conventional photoresist removing solution, e.g. benzenesulfonic acid, and, thereafter, an aluminum film 10 is evaporated on the entire upper surface of the resulting structure, as shown in FIG. 2 (E). The thickness of the deposited aluminum film 10 is approximately 500–3000 A. In this case, the aluminum film 10 has a substantially even thickness distribution and can be uniformly evaporated and formed even when the substrate has stepped portions, so that a subsequent anodization treatment to be carried out will provide a smooth surface.

Subsequent to the formation of the aluminum film 10, on the resulting substrate structure 5–6–7a,7b–8a–8b, the aluminum film 10 is anodized by the use of a 5% oxalic acid as the electrolyte, as described above, to form a porous alumina film 11, as shown in FIG. 2 (F). The conditions of the anodization treatment in this case are the same as the previous treatment.

The thickness of the porous alumina film 11 is approximately 500–3000 A. In this case, the alumina film 8a, 8b overlying the interconnection portions 7a–7b becomes integral with the newly formed alumina film 11. Yet, if desired, the alumina film portions 8a, 8b may be removed prior to the evaporation of the secondary aluminum film 10 without any harmful results.

When the porous alumina film 11 is formed, the thickness of the same can be quite substantial, so as to protect the interconnection portions against external mechanical forces which may be exerted thereon and, with a thick alumina film, the durability of the interconnection portions is enhanced. However, the film 11 does not have a sufficient moisture resistance in and of itself, although it be thickly formed, so that a subsequent anodization treatment is carried out. This anodization treatment is carried out using a 5% ammonium tetraborate solution, with a voltage of 100 volts applied for a period of 5 minutes to form a non-porous alumina film 12a, 12b, thereby covering all of the surfaces of the interconnection portions 7a, 7b, as shown in FIG. 2 (G).

The non-porous alumina film 12a, 12b is formed so that a very thin non-porous portion of the porous alumina film 11 beneath respective porous portions becomes thickened. The thickness of the non-porous alumina film 12a, 12b is approximately 1000–1500 A. Of course, for a desired case it depends upon the applied voltage, with the increase in the thickness saturating after a period of treating time. After a period of about 5 minutes has elapsed, growth of the non-porous alumina film ceases, so that its thickness is at a constant value. Therefore, it may be said that the thickness grows to a value corresponding to the relationship 15 A/volt applied. As a result, for an applied voltage of 100 volts, as described above, a non-porous alumina film 1500 A thick can be obtained. This non-porous alumina film 12a, 12b has extremely good moisture resistance characteristics and, moreover, effectively acts as a protective film against chemical action, so that it further protects the interconnection portions 7a, 7b from corrosion.

As was mentioned above, the protective film on the interconnection portion 7a, 7b can be formed to have a sufficient thickness, by the use of a double structure consisting of a porous alumina film 11 and a non-porous alumina film 12a, 12b so that the protective film becomes quite stable.

Next, as depicted in FIG. 2 (H), unnecessary portions of the porous alumina film 11 are removed, and a protective film 13 formed by chemical-vapor-deposition techniques is formed on the substrate to thereby cover the interconnection portions 7a, 7b. An SiO$_2$ film (0.5 to 0.8 $\mu$ thick), as the protective film, can be used by thermally decomposing silane compounds, for example, a monosilane at 400°C.

Here, because the interconnection portions 7a, 7b have their upper surface ends and sides formed with a gentle slope, the chemical-vapor-deposition film is formed over the interconnection portions 7a, 7b with a uniform thickness and gently slope.

For providing wire bonding pads, the chemical-vapor-deposition film 13 is etched and removed and, since the aluminum interconnection portions 7a, 7b are covered with a porous alumina film 11a, 11b and a non-porous alumina film 12a, 12b, they are not attacked by the etchant so that the secondary effect of etching the chemical-vapor-deposition film etching treatment is prevented.

The protective film to be formed on the surfaces of the interconnection portions may be a structure consisting on only non-porous alumina. In this case, the non-porous alumina film can be formed directly on the entire surfaces of the interconnection portions by the use of a prescribed electrolyte. Although the thickness of the non-porous film is comparatively small, in this case, the non-porous film can act satisfactorily as a protective film, due to its excellent moisture and chemical attacking resistant properties.

From the foregoing description, it will be readily appreciated that the range of application of the method of the present invention can be varied widely and is applicable to aluminum interconnections for transistors, Integrated Circuits, and Large Scale Integrated Circuits. For the manufacture of a multi-layer interconnection structure, it is applicable to the interconnection portions of all the layers or, if desired, it may be applied to only a single layer interconnection and to a single electrode.

While We have shown and described one embodiment in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

We claim:

1. A method of forming a protected interconnection layer overlying the surface of a substrate structure comprising the steps of:
   a. forming a first metallic layer over the surface of said substrate structure;
   b. anodically oxidizing a thin portion of the upper surface of said first metallic layer to form a first porous metallic-oxide insulating film on said first metallic layer;
   c. selectively removing prescribed portions of said porous film and said first metallic layer to expose the surface of said substrate structure and to form gradually sloping side surfaces of said first metallic layer;
   d. forming a second metallic layer on the entire surface of the substrate structure and layer resulting from said (c);
   e. anodically oxidizing said second metallic layer to form a second porous metallic oxide film therefrom;
   f. anodically converting the surface portion of said first metallic layer facing said second porous metallic oxide film into a non-porous metallic oxide film;
   g. removing portions of said second porous metallic oxide film lying in the etched-out portions of said first metallic layer on said substrate structure; and
   h. forming, by chemical vapor deposition, a further protective insulating film on the substrate resulting from step (g).

2. A method according to claim 1, wherein said metallic layers are made of aluminum, said porous oxide films are alumina films, and said step (f) comprises anodizing the first aluminum layer to form a thin non-porous alumina film.

3. A method according to claim 2, wherein said step (c) comprises selectively etching said prescribed portions of said first porous alumina film and said first aluminum layer with an etchant, the etching rate of which with respect to said aluminum layer is smaller than its etching rate with respect to said first alumina layer.

4. A method according to claim 3, wherein said step (b) comprises the step of anodizing said thin portion of the upper surface of said first aluminum layer to form a first porous alumina insulating film.

* * * * *